Aug. 9, 1966 A. FELLER 3,265,906
INVERTER CIRCUIT IN WHICH A COUPLING TRANSISTOR FUNCTIONS SIMILAR TO CHARGE STORAGE DIODE
Filed Oct. 8, 1964
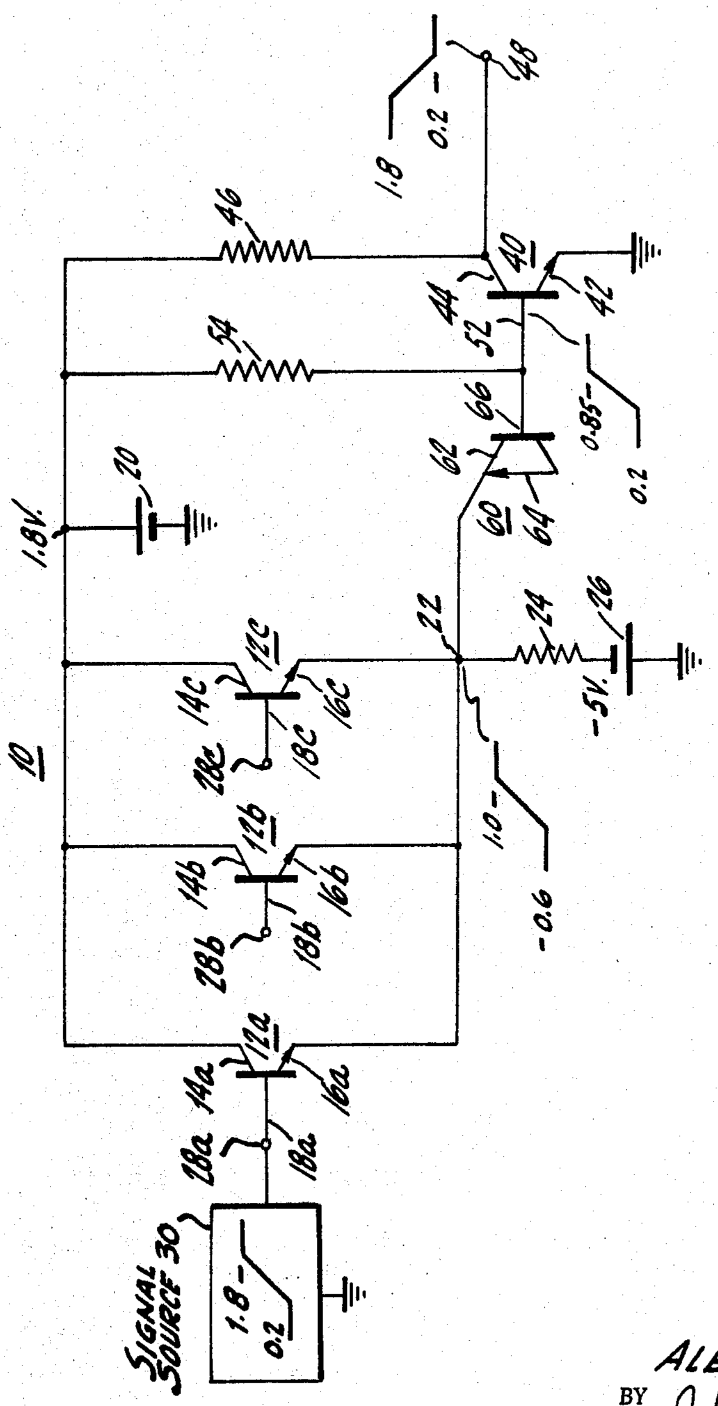
INVENTOR.
ALBERT FELLER
BY John V. Regan
Attorney United States Patent Office 3,265,906 Patented August 9, 1966

3,265,906

INVERTER CIRCUIT IN WHICH A COUPLING TRANSISTOR FUNCTIONS SIMILAR TO CHARGE STORAGE DIODE

Albert Feller, Cinnaminson, N.J., assignor to Radio Corporation of America, a corporation of Delaware Filed Oct. 8, 1964, Ser. No. 402,540
5 Claims. (Cl. 307—88.5)

This invention relates to electrical circuits and, in particular, to a novel logic circuit in which a transistor having the properties of a charge diode operates to provide both rapid turn-on and rapid turn-off of a transistor inverter driven between saturation and cut-off.

It has been suggested that emitter follower gates be used to perform switching and logic functions in a digital computer. Emitter followers usually are not operated in saturation, whereby they have a very high speed of response and minimum signal delay, and are capable of being operated at a very high information repetition rate. However, emitter followers do not provide the signal inversion which is required in many applications. Moreover, there is a shift in signal voltage level between the input and output thereof, and the level shifts become cumulative when emitter follower gates are cascaded.

A transistor connected in the common emitter configuration and driven from the output of the emitter follower gate can provide amplification and signal inversion. To provide the desired signal level restoration, the inverter transistor generally is driven between cut-off and saturation. Most known inverter circuits of this type require large input signal swings and a large number of different bias supply voltages. Large voltage swings are accompanied by high power dissipation in various ones of the circuit's components. Operating the transistor in cut-off results in a turn-on delay and reduces the repetition rate of the circuit unless techniques are employed to turn the transistor on rapidly. Operating the transistor in saturation results in excess minority carrier storage, which storage results in a large turn-off delay unless techniques are employed to bring the transistor out of saturation rapidly.

One technique known for turning the transistor on rapidly is to apply a large turn-on overdrive signal from a bias source, but this generally results in deep saturation of the transistor in the quiescent "on" condition since this same source also supplies the quiescent "on" current. On the other hand, techniques are known for limiting the level of saturation of the transistor, but such techniques generally do not lend themselves to the provision of a large turn-on overdrive. In general, available techniques for providing large turn-on overdrive and limited saturation have been employed in the same circuit configuration, whereby the use of a transistor inverter increases the signal delay through, and decreases the repetition rate of, the overall circuit and prevents full use of many of the advantages of emitter follower gates.

It is among the objects of this invention to provide an improved transistor inverter having both reduced turn-on and reduced turn-off delays.

It is another object of this invention to provide an improved transistor inverter in which the level of saturation is controlled and in which both large turn-on and large turn-off overdrives are provided.

It is a further object of this invention to provide an improved logic circuit employing an emitter follower gate and a transistor inverter in which the output of the gate is coupled to the input of the inverter by way of a transistor having the properties of a charge diode.

It is still another object of this invention to provide an improved logic gate of the type immediately aforementioned in which charge stored in the coupling transistor is used to provide short duration turn-on overdrive for the inverter transistor and in which forward current flow through the coupling transistor produces fast turn-off of the inverter transistor.

It is another object of this invention to provide an improved logic circuit which may be manufactured in integrated form using presently available processing techniques.

In brief, the coupling transistor has its collector directly connected to its emitter. The coupling transistor is connected at the input of an inverter transistor of the same conductivity type, with the emitter-base diode of the coupling transistor oppositely poled with respect to the emitter-base diode of the inverter transistor. A resistor is connected between the input of the inverter transistor and a point of fixed potential, and supplies a controlled current to the inverter transistor during the quiescent "on" condition thereof.

In the sole figure of the drawing, the emitter follower gate 10 is shown for illustrative purposes as comprising three transistors 12*a*–12*c* of NPN type conductivity. The collectors 14*a*–14*c* of the transistors 12*a*–12*c*, respectively, are connected directly together and to the positive terminal of a source of bias potential, illustrated as a battery 20 having its negative terminal connected to circuit ground, whereby the transistors 14*a*–14*c* are connected in the common collector configuration. The emitter electrodes 16*a*–16*c* also are connected directly together and to a junction point 22. A common emitter resistor 24 is connected between junction point 22 and the negative terminal of a source of bias potential, illustrated as a battery 26 having its positive terminal connected to circuit ground.

Input signals are applied at a terminal 28*a* at the base 18*a* of transistor 12*a* from a signal source represented by box 30. As will be apparent as the discussion proceeds, signal source 30 may be, for example, another circuit of the overall type illustrated schematically in the drawing. Other signal sources (not shown) may be connected at the base input terminals 28*b* and 28*c* of the transistors 12*b* and 12*c*, and may be of the same type as the signal source 30. The signals applied at the various bases 18*a*–18*c* swing between the same nominal voltage levels.

The inverter portion of the circuit comprises a transistor 40 of NPN type conductivity having an emitter electrode 42 connected to circuit ground and a collector 44 connected by way of a supply resistor 46 to the positive terminal of battery 20. Output signals are derived at a terminal 48 connected at the collector 44. The base 52 of transistor 40 receives its bias current by way of a resistor 54 connected between the base 52 and the positive terminal of battery 20. The base 52 also is coupled to the output of the emitter follower gate 10 by way of a transistor 60 of NPN type conductivity having its collector 62 and emitter 64 connected directly together and to the junction point 22, and having its base 66 directly connected to the base 52 of the inverter transistor 40.

Because of the particular manner in which coupling transistor 60 is connected, it has the properties of a charge diode. By connecting the collector 62 and emitter 64 directly together, the collector-base junction and emitter-base junction are poled in the same direction between junction point 22 and the base 52 of inverter transistor 40. Accordingly, whenever the emitter 64-base 66 junction is forward biased and conducting current, the collector 62-base 66 junction also is forward biased. Since only majority current can flow in the collector 62, all of the base current is excess base current and results in minority carrier storage in the transistor 60. The charge which is actually stored when the transistor 60 conducts in the forward direction is the product of the base 66 current flow and the storage charge time constant $T_s$ of the transistor 60, which time constant is a characteristic of the type of transistor employed.

Consider now the operation of the circuit and assume the following circuit parameters by way of example: resistor 24=600 ohms, resistor 54=1.6K ohms, resistor 46=85 ohms, battery 20=1.8 volts and battery 26=5 volts. In addition, all of the transistors are assumed to be silicon, and the input signals swing between +0.2 volt and 1.8 volts. The criteria for selecting the various component values will become clear as the discussion proceeds.

When all of the input signals, at bases 12a–12c have a value of +0.2 volt, the voltage at the junction point 22 has a value of approximately −0.6 volt due to the drop across the base-emitter diode of an emitter follower transistor 12a–12c. Assuming that all of the emitter follower transistors have characteristics which are approximately the same, all of these transistors conduct for this condition. With −0.6 volt at junction point 22, the emitter 64-base 66 junction of coupling transistor 60 is forward biased and current flows, in the conventional sense, from battery 20 through resistor 54 to the base 66, and from the emitter 64 and collector 62 through common emitter resistor 24 to battery 26. Coupling transistor 60 clamps the voltage at the base 52 of the inverter transistor 40 at a value of approximately +0.2 volt, whereby the inverter transistor 40 is cut-off and the output at terminal 48 is +1.8 volts, the upper level of the input swing. The base current for the coupling transistor 60 is approximately one mllliampere for circuit values given. For reasons explained previously, coupling transistor 60 operates in saturation whenever it is biased in the "on" condition. The charge stored in this transistor is the product of its base current and the storage charge time constant characteristic of the transistor.

When the input signal at one or more of the input terminals, terminal 28a for example, rises to +1.8 volts, the voltage at junction point 22 rises in a positive direction toward +1.0 volt. The voltage at the base 52 of inverter transistor 40 also rises and reaches a value sufficient to begin turning on transistor 40 before the voltage at junction 22 reaches +1.0 volt. Becase of its stored charge, coupling transistor 60 provides a very low dynamic impedance path from the emitter 16a of transistor 12a to circuit ground through the forward biased base-emitter diode of inverter transistor 40. Current flows over this path and into the base 52 of the inverter transistor 40 as the stored charge is swept out of coupling transistor 60. By definition, charge is the product of current and time. Since the impedance of the aforementioned path is very low, a large current flows for a short interval of time as the stored charge is swept out of coupling transistor 60. Viewed in another manner, the charge stored in coupling transistor 60 is transferred rapidly to inverter transistor 40. This large surge of current provides a large turn-on overdrive for turning on the inverter transistor 40 rapidly, and is aided by base current supplied through the resistor 54 from battery 20.

With transistor 40 on and in saturation, the voltage at output terminal 48 is approximately +0.2 volt, equal to the lower level of the input signal swing. Thus, it is seen that the overall circuit performs the positive NOR logic function when an input level of +1.8 volts represents a binary "1" bit and an input level of +0.2 volt represents a binary "0" bit of information.

To guarantee that inverter transistor 40 is turned on rapidly by the coupling transistor 60, the charge stored in the coupling transistor 60 should be greater than the charge required to "bottom" transistor 40, together with whatever charge is necessary to charge the various capacitances, interelectrode and parasitic, at the base 52. By "bottoming" is meant that maximum collector current $I_{c\,max.}$ or $I_{c\,sat.}$ flows in the collector of inverter ransistor 40. Thus, the charge stored in coupling transistor 60 when it conducts should be greater than the product $I_{c\,sat.}\,T_c$, where $T_c$ is the collector time constant of inverter transistor 40 and is a characteristic of the transistor. When discrete components are employed, this condition may be realized by selecting for transistor 60 one which has a sufficiently high storage charge time constant. When the circuit is fabricated in monolithic form, all of the transistors generally are of the same type. For transistors of the same type, the charge stored in coupling transistor 60 should be sufficient to "bottom" inverter transistor 40 because of the large base current flow in the coupling transistor 60. The stored charge can be increased, if necessary or as a safety factor, by tailoring the storage charge time constant of the coupling transistor 60 during the fabrication process by controlling the base width thereof. This can be done, for example, by proper masking and by controlling the diffusion time when the base region is formed in transistor 60.

As soon as the charge stored in coupling transistor 60 has been depleted, its emitter 64-base 66 diode becomes reverse-biased. This transistor then provides immunity to noise signals applied at the base 18a of transistor 12a. Once coupling transistor 60 becomes nonconducting, the base current for inverter transistor 40 is supplied solely by way of resistor 54 from battery 20. Resistor 54 is selected in value to provide a desired operating point for the inverter transistor 40. Specifically, resistor 64 may be chosen in value to provide that amount of base current which is necessary to just bias inverter transistor 40 into saturation, whereby the transistor 40 may have a very low saturation charge. Thus, the combination of the coupling transistor 60 and resistor 54 has the distinct advantage that coupling transistor 60 provides a large surge of current for large turn-on overdrive of transistor 40 during the switching transient, and that thereafter a controlled base current is supplied by resistor 54 for operating the transistor 40 quiescently in the "on" condition at a low saturation level.

In the mass production of the illustrated circuit in integrated form, the betas of the inverter transistors 40 may vary from unit to unit. In that case, the value of resistor 54 generally is selected so that an inverter transistor 40 of the minimum expected beta is operated just in saturation during its on condition. This means that transistors of higher beta will be receiving greater base current than is required to saturate the transistor. This excess base current results in minority carrier storage which is additive with the active region charge in the transistor 40. As may be seen from the following example, however, this storage charge is held to a reasonable limit because of the inherent properties of the particular circuit configuration.

Consider that the base 52 voltage is +0.85 volt in the saturated condition of the transistor 40. The maximum base 52 current which can flow is approximately $$\frac{1.8-0.85}{1600}=0.59 \text{ milliamperes}$$

Even under worse case conditions (maximum beta), the excess base 52 current will not exceed 0.5 milliamperes. For a transistor such as the RCA 2N2332, the maximum excess stored charge for this value of excess base current is only about four picocoulombs. The active region charge $I_{c\,sat.}\,T_c$ for such a transistor is approximately six picocoulombs, corresponding to twenty milliamperes collector current, and including collector capacity charge. Hence, inverter transistor 40 may be turned off rapidly by sweeping out ten picocoulombs of charge from the base region of the inverter transistor 40. This corresponds, for example, to a reverse base current of ten milliamperes flowing for the short period of one nanosecond. The manner in which this reverse base current is provided will now be described.

When the input signal at the base 18*a* of transistor 12*a* falls to +0.2 volt, (assuming all other inputs at +0.2 volts) transistor 12*a* generally will disconnect temporarily. In particular, the capacitive loading at the junction point 22 will prevent the voltage at junction point 22 from falling instantaneously to −0.6 volt when the input signal falls to +0.2 volt. The capacitance at junction point 22 results from the fact that the output is taken at the junction point 22. The effect of this capacitance is to cause the emitter 16*a*-base 18*a* junction of emitter follower transistor 12*a* to become reverse-biased for a short period of time until the capacitance has discharged a sufficient amount. During the interim period, the ten milliamperes of current that previously was flowing through common emitter resistor 24 is available to turn-off inverter transistor 40. That is to say, the emitter 64-base 66 junction of coupling transistor 60 becomes forward biased as the capacitance in junction point 22 discharges a sufficient amount. Once forward biased, coupling transistor 60 clamps the voltage at junction point 22 until inverter transistor 40 turns off, and provides a very low impedance path between battery 26 and the base 52 of the inverter transistor 40. As mentioned previously, a current of ten milliamperes flowing for one nanosecond is sufficient to turn off the inverter transistor 40.

In summary, the use of the coupling transistor 60 in the manner described provides large turn-on overdrive for inverter transistor 40 and also provides large turn-off overdrive for the transistor 40, as well as providing immunity to negative noise signals applied at any of the input terminals when the transistor 60 is in the off condition. The resistor 54 supplies the sole bias current for inverter transistor 40 during its quiescent "on" condition and, therefore, can be tailored to provide a desired level of limited saturation of the inverter transistor. An advantage of the overall circuit, in addition to its high speed of operation and minimum signal delay, is the fact that it is integratable in monolithic form using known and available fabrication techniques, since only transistors of one conductivity type are required, none of the resistors is of large value, and selective gold doping is not required. Also, the low voltage swings result in low power dissipation consistent with the requirements of integrated circuits. Another advantage is that the circuit has almost the turn-off speed of a transistor operated in the linear active mode, yet has the two well defined levels of the saturated switch.

What is claimed is:

1. The combination comprising:
an output transistor of one conductivity type having an emitter electrode connected to a point of reference potential, a base and a collector;
an impedance element having one end connected at said collector;
means for applying operating potential between the other end of said impedance element and said point of reference potential;
a resistor connected at one end to the base of said output transistor;
means for connecting a bias source at the other end of said resistor in a polarity direction tending to forward bias the base-emitter diode of said output transistor, said resistor providing the sole path for base current in said output transistor in the quiescent "on" condition thereof;
a junction point;
a coupling transistor of said one conductivity type having a base connected directly to the base of said output transistor, and a collector and an emitter directly connected together and to said junction point; and
input means coupled to said junction point for varying the voltage thereat between first and second values in opposite polarity directions with respect to said reference potential for forward biasing and reverse biasing, respectively, the emitter-base diode of said coupling transistor.

2. The combination comprising:
an input transistor of one conductivity type connected in the common collector configuration and having a base and an emitter;
a resistor and a source of biasing potential serially connected between said emitter and a point of reference potential, the source of biasing potential being poled in a direction to forward bias the emitter-base junction of said input transistor;
an output transistor of said one conductivity type having an emitter directly connected to said point of reference potential, a collector and a base;
a collector supply resistor connected at one end to the collector of said output transistor;
a base resistor connected between the base of said output transistor and the other end of the collector supply resistor;
means for connecting a source of operating potential between said point of reference potential and said other end of said collector supply resistor;
a coupling transistor of said one conductivity type having a base connected directly to the base of said output transistor, and having an emitter and a collector directly connected together and to the emitter of said input transistor; and
means for varying the voltage at the base of said input transistor between first and second values to forward bias and reverse bias, respectively, the emitter-base diode of said coupling transistor.

3. The combination comprising:
an input transistor of one conductivity type connected in the common collector configuration and having a base and an emitter;
a resistor and a source of biasing potential serially connected between said emitter and a point of reference potential, the source of biasing potential being poled in a direction to forward bias the emitter-base junction of said input transistor;
an output transistor of said one conductivity type having an emitter directly connected to said point of reference potential, a collector and a base;
a collector supply resistor connected at one end to the collector of said output transistor;
a base resistor connected between the base of said output transistor and the other end of the collector supply resistor;
means for connecting a source of operating potential between said point of reference potential and said other end of said collector supply resistor;
a coupling transistor of said one conductivity type having a base connected directly to the base of said output transistor, and having an emitter and a collector directly connected together and to the emitter of said input transistor; and
input signal means coupled to the base of said input transistor for varying the voltage at the emitter thereof between first and second values of opposite polarity relative to said reference potential for forward biasing and reverse biasing, respectively, the emitter-base diode of said coupling transistor.

4. The combination comprising:
an output transistor of one conductivity type having an emitter connected to a point of reference potential, a collector and a base, and having a collector time constant $T_c$;
a source of biasing potential and a collector supply resistor connected between said collector and said point of reference potential, said resistor having a value which limits the maximum collector current to a value $I_{c\,max.}$;
a coupling transistor of said one conductivity type having a base connected to the base of said output transistor, and a collector and an emitter connected directly together and to a junction point;

a resistor having one end connected in common to the bases of the output and coupling transistors, and having its other end connected to said source of biasing potential;

input signal means coupled to said junction point for varying the voltage thereat between first and second levels, the first level being in the same polarity direction relative to said reference potential as the voltage supplied by said bias source, the second level being in the opposite polarity direction and having a value to cause a base current $I_b$ to flow in said coupling transistor; and said coupling transistor having a storage charge time constant $T_s$, where $T_s$ has such a value that $$I_b T_s > I_{c\ max.} T_c + \Delta V_{be}(\overline{C}_{te} + \overline{C}_{tc})$$

where $\Delta V_{be}$ is the signal swing at the base of the output transistor and $\overline{C}_{te}$ and $\overline{C}_{tc}$ are the average emitter and collector junction capacitances over the signal swing $\Delta V_{be}$.

5. The combination comprising:

an input gate including a plurality of transistors of one conductivity type each having a base, an emitter and a collector and being connected in the common collector configuration, a common emitter resistor having one end connected in common to the emitter electrodes of said plurality of transistors, and a source of bias potential connected between the other end of said common emitter resistor and a point of reference potential and being poled in a direction tending to forward bias the emitter-base diodes of said transistors;

an output transistor of said one conductivity type connected in the common emitter configuration and having a base and a collector, said output transistor having a collector time constant $T_c$;

a collector supply resistor connected in circuit between the collector and emitter of said output transistor and having a value to limit the maximum collector current in said output transistor to a value $I_{c\ max.}$;

a resistor connected in circuit between the base and emitter of said output transistor and providing the sole path for base current for said output transistor in the quiescent "on" condition thereof;

a coupling transistor of said one conductivity type having a base connected by negligible impedance means to the base of said output transistor, and having a collector and an emitter connected directly together and to a point common to the emitters of said plurality of transistors;

means for applying input signals at the bases of said plurality of transistors to vary the voltage at the emitters thereof between first and second values for forward biasing and reverse biasing, respectively, the emitter-base diode of said coupling transistor, said first value causing a current $I_b$ to flow in the base of said coupling transistor; and said coupling transistor having a storage charge time constant $T_s$, where $I_b T_s > I_{c\ max.} T_c + \Delta V_{be}(\overline{C}_{te} + \overline{C}_{tc})$, where $\Delta V_{be}$ is the signal swing at the base of the output transistor and $\overline{C}_{te}$ and $\overline{C}_{tc}$ are the average emitter and collector junction capacitances over that signal swing.

No references cited.

ARTHUR GAUSS, *Primary Examiner.*

J. BUSCH, *Assistant Examiner.*